United States Patent
Pavao-Moreira et al.

(10) Patent No.: US 9,660,578 B2
(45) Date of Patent: May 23, 2017

(54) ELECTRONIC DEVICE WITH CAPACITOR BANK LINEARIZATION AND A LINEARIZATION METHOD

(71) Applicant: FREESCALE SEMICONDUCTOR, INC., Austin, TX (US)

(72) Inventors: Cristian Pavao-Moreira, Frouzins (FR); Olivier Vincent Doare, La Salvetat St Gilles (FR); Birama Goumballa, Larra (FR); Didier Salle, Toulouse (FR)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 14/991,043

(22) Filed: Jan. 8, 2016

(65) Prior Publication Data

US 2017/0040943 A1    Feb. 9, 2017

(30) Foreign Application Priority Data

Aug. 6, 2015  (WO) .................. PCT/IB2015/001567

(51) Int. Cl.
| | |
|---|---|
| *H03B 5/08* | (2006.01) |
| *H03B 5/12* | (2006.01) |
| *H03L 7/099* | (2006.01) |
| *H01G 15/00* | (2013.01) |

(52) U.S. Cl.
CPC ........... *H03B 5/1265* (2013.01); *H01G 15/00* (2013.01); *H03B 5/1212* (2013.01); *H03B 5/1215* (2013.01); *H03B 5/1228* (2013.01); *H03L 7/099* (2013.01)

(58) Field of Classification Search
CPC ....... H03L 7/099; H01G 15/00; H03B 5/1215
USPC ..................... 331/179, 167, 57, 176, 117 FE
See application file for complete search history.

(56) References Cited

U.S. PATENT DOCUMENTS

| | | |
|---|---|---|
| 7,800,458 B2 | 9/2010 | Shin et al. |
| 2008/0129398 A1* | 6/2008 | Sun ........................... H03L 7/10 331/117 FE |
| 2012/0286586 A1* | 11/2012 | Balm ....................... H03F 1/56 307/109 |
| 2013/0194050 A1 | 8/2013 | Lee |

* cited by examiner

*Primary Examiner* — Arnold Kinkead

(57) ABSTRACT

An electronic device comprises a controllable capacitor bank and a capacitive divider arranged in parallel with the capacitor bank and configured to linearize the capacitor bank in a linearization frequency range of a frequency characteristic of the electronic device. The capacitive divider comprises a series arrangement of a first series capacitance, and a main capacitor bank. A control circuit coupled to one or more control inputs of the capacitive divider and controllable capacitor bank is configured to modify the equivalent capacitance of the capacitive divider and the controllable capacitor bank for providing capacitance steps, each capacitance step being variable over frequency such that for each step a frequency change Δf of the frequency characteristic is maintained constant in the linearization frequency range.

20 Claims, 6 Drawing Sheets

ELECTRONIC DEVICE WITH CAPACITOR BANK LINEARIZATION AND A LINEARIZATION METHOD

CROSS-REFERENCE TO RELATED APPLICATION(S)

The present application claims priority to PCT Patent Application No. PCT/IB2015/001567, filed Aug. 5, 2015, entitled "AN ELECONIC DEVICE WITH CAPACITOR BANK LINEARIZATION AND A LINEARIZATION METHOD," the Entirety of which is herein incorporated by reference.

FIELD OF THE INVENTION

This invention relates to an electronic device incorporating a capacitive divider for linearizing a controllable capacitor bank, an integrated circuit incorporating the electronic device and a method of linearizing a controllable capacitor bank of the electronic device.

BACKGROUND OF THE INVENTION

In ring oscillators or wide-band digital controlled oscillators, the oscillation frequency is typically controlled within a predetermined frequency range by a large number of switchable capacitors that change the total capacitance of the oscillation frequency in steps. Since the oscillation frequency is typically a non-linear function of the total capacitance, a fixed step change of the total capacitance results in a corresponding step change of the oscillation frequency which decreases with frequency if the step change of the total capacitance is positive, or increases with frequency if the step change of the total capacitance is negative.

As a consequence, since the oscillation frequency cannot be accurately controlled, even a larger number of switchable capacitors is required to cover the full predetermined frequency range with acceptable resolution.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements, which correspond to elements already described, may have the same reference numerals.

DETAILED DESCRIPTION OF THE PREFERRED EMBODIMENTS

Embodiments of the present invention provide digital controlled oscillators that incorporate a capacitive arrangement of switchable capacitors whose equivalent total capacitance determines an output frequency of the respective oscillator (e.g., frequency of oscillation). The capacitive arrangement is suitably controlled for linearizing the total capacitance of the oscillators whose oscillation frequency is non linearly dependent of said total capacitance. The capacitive arrangement includes a controllable capacitor bank and a capacitive divider arranged in parallel with the capacitor bank. The capacitive arrangement is controlled to provide capacitance steps changing the oscillation frequency in a linearization frequency range of the oscillation frequency. The capacitive arrangement is controlled such that each capacitance step is variable over frequency in order to maintain said change of the oscillation frequency for each capacitance step, constant over frequency. The capacitive divider provides a relatively small equivalent capacitance to the controllable capacitor bank such that the total capacitance can be linearized with high linearization resolution within a linearization frequency range of the oscillation frequency. A higher linearization resolution can thus be achieved for the same or greater number of switchable capacitors used in the prior art.

Figure 1:
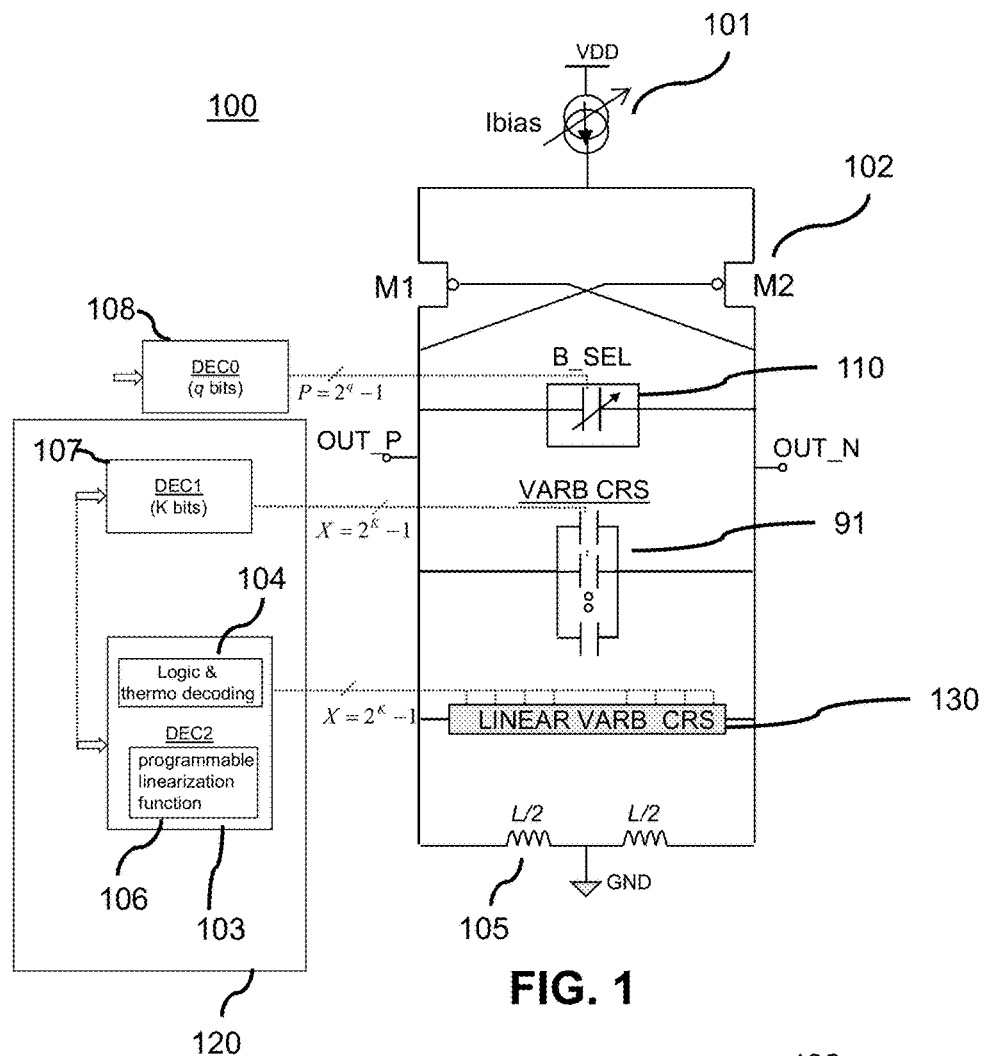
FIG. 1 shows a first embodiment of a digital controlled oscillator.
Figure 2:
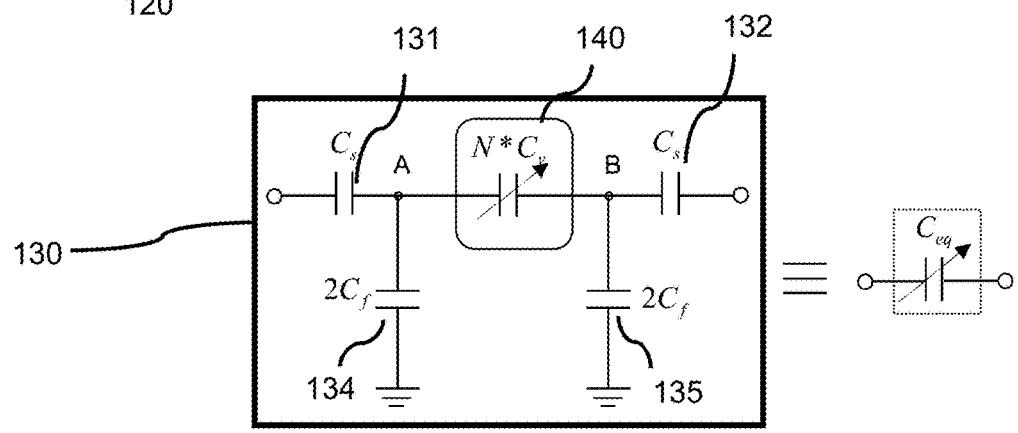
FIG. 2 schematically shows a differential example of an embodiment of a capacitive divider for the digital controlled oscillator shown in FIG. 1, FIG. 3 visually shows the effect of linearization on the oscillation frequency of an electronic device.

FIG. 1 shows a first example of an oscillator circuit 100 according to an embodiment of the invention. The oscillator circuit 100 is controlled and linearized by a capacitive arrangement including a capacitive divider 130. The capacitive divider 130 is shown in FIG. 2. The oscillator is an inductance/capacitance (LC) based voltage controlled oscillator (VCO) application or a digital controlled oscillator (DCO).

The oscillator 100 (VCO/DCO) uses the proposed capacitive divider and has a programmable current source (Ibias) 101, of which the current value is set to the minimum current that guarantees VCO/DCO oscillation condition. A pair 102 of cross-coupled PMOS transistors, M1/M2, provides a negative resistance to a LC circuit comprising coils 105 and a capacitive arrangement 110, 91 (also called LC tank), for generating the oscillation.

A digitally-controlled band selection capacitor bank B_SEL 110 may be used for compensating process variation and enabling frequency trimming to a preferred operation range (band select) according to an input control. A specific binary-to-thermometric decoder 108 (DEC0) can also be used in order to select a group of capacitors inside the band selection capacitor bank 310. Binary-to-thermometric decoding is a well-known decoding technique that allows to get from n binary inputs, $2^n-1$ binary outputs with reduced switching noise. Each binary output corresponds to a base 10 value of the possible binary input and has only one bit value different from the previous and subsequent binary output in the sequence of binary outputs.

The decoder 108 DEC0 can have q input bits meaning $P=2^q-1$ outputs for controlling the B_SEL capacitor bank 110. This decoder can be replaced in some applications by a q bits binary weighted control.

The inductor L 105 has a center-tapped structure, the center tap being coupled to a ground reference (GND), and a controllable capacitor bank 91 (coarse VARB_CRS) is used as an input port, for example in Phase-Locked Loop (PLL) circuits using a two-port modulation scheme.

The controllable capacitor bank 91 and the capacitive divider 130 are controlled by a control circuit 120. The control circuit 120 can include a first control circuit 103 configured to control the capacitive divider 130 and a second control circuit 107 configured to control the controllable capacitor bank 91. The second control circuit 107 can be a decoder (DEC1) coupled to the respective input terminal of the controllable capacitor bank 91. The decoder 107 can for example convert a binary input to a thermometric set of control outputs to be coupled to the capacitors of the controllable capacitor bank 91. A first decoder 107 (DEC1) having K input bits and $X=2^K-1$ outputs can control the controllable capacitor bank 91.

The first control circuit 103 can be a second decoder DEC2 having also, in this example, K input bits and $X=2^K-1$ outputs. The second decoder DEC2 can control the capacitive divider 130 for linearizing the controllable capacitor bank 91.

In a practical example DEC1 is a binary to thermometric decoder to select the number of coarse capacitors needed to obtain an oscillation frequency close to the required. The second decoder DEC 2 can include a binary to thermometric decoder 104 used to dynamically set (during DCO calibration) the number of switchable capacitors needed to linearize the controllable capacitor bank in a required linearization frequency range. The code value of the first decoder DEC1 and the second decoder DEC2 can be determined before each transmission, and for each sample.

The second decoder DEC 2 303 can include a programmable linearization function block 306 suitable to determine a linearization function (described later with reference to equation (3)) to linearize the controllable capacitor bank 91 in the predetermined linearization frequency range.

The above capacitive-based arrangement 91, 130 is composed by a capacitor bank 91 with 1 to X identical capacitors, and a capacitive divider 130 shown in FIG. 2.

The capacitive-based arrangement 91, 103 is placed between DCO positive and negative output nodes (OUT_P, OUT_N). The capacitive divider 130 has a main capacitor bank (shown later in FIG. 2) composed by 1 to N unit capacitors. N may be selected during a DCO calibration procedure, via a dichotomy procedure. The calibration may be performed before each transmission and for each sample.

The controllable capacitor bank 91 is a bank of 1 to X identical unit capacitors driven by a thermometric set of control signals. Thereby 1 to X capacitors can be selected to obtain a given coarse frequency step as required by a modulation scheme used.

The band selection capacitor bank B_SEL 310, the controllable capacitor bank 91 and the capacitive divider 130 can include switches that can be controlled by the respective decoders 108, 107 and 106 such to obtain the desired respective equivalent capacitance.

FIG. 2 schematically shows a differential example of a capacitive divider 130 for the voltage controlled oscillator 100 shown in FIG. 1 according to an embodiment of the invention. The capacitive divider 130 includes a series arrangement of a first series capacitance $C_s$ and a main capacitor bank N*Cv, a first shunt capacitance $2C_f$ having one terminal arranged between the first series capacitor 131 and the main capacitor bank NCv and the other terminal coupled to the reference potential GND, a second series capacitance 132 electrically connected in series with the main capacitor bank N*Cv and with the controllable capacitor bank (not shown in FIG. 2) and a second shunt capacitance ($C_s$) having one terminal arranged between the main capacitor bank N*Cv and the second series capacitance 132 and another terminal electrically connected to the reference potential. The main capacitor bank $N*C_v$ includes a N number of parallel electrically coupled switchable capacitors Cv. By switching one capacitor unit of size Cv of the main capacitor bank N*Cv at a time, an equivalent capacitance step is created between the differential outputs nodes of the DCO shown in FIG. 1, enabling achieving a required frequency linearization resolution for the respective controllable capacitor bank 91 shown in FIG. 1. The shunt ($2C_f$) and series ($C_s$) capacitance can be single capacitors or capacitor banks of the desired value and be both controllable by respective control circuits (not shown in the Figures), enabling a further tuning of the achievable linearization resolution. It is noted that, in the series and/or shunt capacitance, a number of capacitors may be grouped, and controlled via one group input signal per group. Referring again to FIG. 1 the first decoder 107 and the second decoder 103 are configured to modify the equivalent capacitance of the capacitive divider 130 and the controllable capacitor bank 91 by activating one or more capacitors of the main capacitors bank N*Cv for providing capacitance steps, each capacitance step being variable over frequency such that for each capacitance step a frequency change Δf of the frequency characteristic (fosc) is maintained constant in a linearization frequency range.

The capacitance steps can be substantially linearly dependent on the smallest equivalent capacitance ΔCeq of the divider 130. The smallest equivalent capacitance of the divider 130 is obtained when only one capacitor of capacitor unit size Cv of the main bank N*Cv is activated, for example by switching on respective switches in series (not shown in the Figures) with the unit size capacitor Cv.

Figure 3:
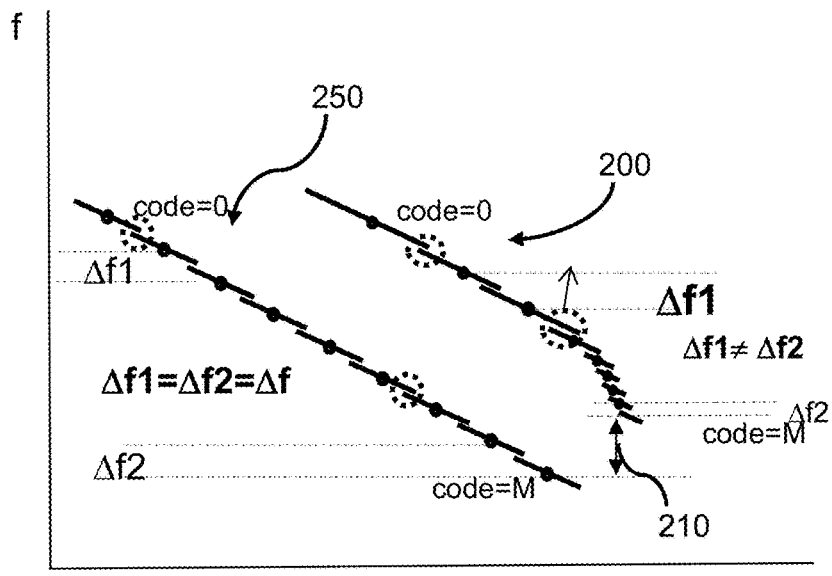

FIG. 3 visually shows the linearization effect obtained by controlling the capacitive divider 130 and the controllable capacitor bank 91 according to one embodiment of the invention.

FIG. 3 shows the variation of the frequency of oscillation of an electronic device, in a frequency range versus various input digital codes, in this example code 0 to code M. Line 200 shows the variation of said frequency of oscillation when no linearization occurs, while line 250 shows the variation of the frequency of oscillation when linearization is performed on the controllable capacitor bank 91. Line 200 shows that if a constant capacitive step is added to the equivalent capacitance corresponding to a particular frequency of oscillation, frequency change is not constant but reduces with decreasing frequency, i.e. the frequency change corresponding to a last code M, $\Delta f_2$ is smaller than the frequency change corresponding to a first code 0, $\Delta f_1$.

When a frequency variable capacitance step is added to the equivalent capacitance corresponding to the particular frequency of oscillation of the electronic device and this variable capacitance step is for example chosen to be substantially linearly dependent (or an integer multiple of) on the smallest equivalent capacitance ΔCeq of the divider 130, the two frequency changes $\Delta f_2$ and $\Delta f_1$ are kept constant within the linearization frequency range, i.e. $\Delta f_1=\Delta f_2=\Delta f$ in the linearization frequency range for each code from 0 to M.

In this way the full frequency oscillation range can be covered with a limited amount of hardware overhead without degrading the phase noise performance of the electronic device and without reducing the tuning range. For example, if line 200 was to be used, extra capacitors would be needed to cover the missing frequency range 210 compared to line 250.

Furthermore by having a variable frequency resolution as in line 200, different quantization noise can be generated for each code which can degrade the overall phase noise performance of the electronic device. The contribution of the different quantization noise is well controllable and predictable when the frequency change Δf is maintained constant.

The proposed linearization technique is easier to implement than prior art linearization technique. In fact control of the capacitive divider 130 and controllable capacitor bank 91 is predictable and determined by the condition that the frequency change is kept constant. No complex calibration algorithm, relative large memories to store complex look-up table are required as in the prior art linearization techniques.

In a further example the controllable capacitor bank 91 and the capacitive divider 130 can be arranged such that the smallest equivalent capacitance of the divider is smaller than the smallest equivalent capacitance of the controllable capacitor bank. This allows yet a better linearization resolution of the controllable capacitor bank in the frequency range.

The controllable capacitor bank can be implemented in any manner suitable for the specific implementation.

The controllable capacitor bank can include a capacitive divider of the same type described with reference to FIG. 2. The capacitor bank 91 can include a further capacitive divider for a finer tuning of the output frequency of the DCO100. Said further capacitive divider, not shown in FIG. 2, can have, as the capacitive divider 130, two identical "shunt" capacitors or "shunt" capacitor banks, each having W number, W being integer, of parallel coupled unit capacitors each one connected between nodes A and B and ground. The number of unit capacitors statically activated via the decoder is a function of the required frequency resolution (Fres). The higher W, the lower Fstep. It allows a fine tuning of the nominal/available Fres. Finally, said further capacitive divider can have two "series" capacitor banks, aCv, "a" is an integer, connected between nodes A and OUT_P, and B and OUT_N. By activating on/off these capacitors one can increase/decrease the frequency by large steps (coarse tuning). The higher the equivalent capacitor of the further capacitive divider (by switching the capacitors on), the lower Fstep.

The capacitive arrangement including the controllable capacitor bank and the capacitive divider for linearizing the controllable capacitor bank can be used in any electronic device specific for the specific implementation.

Figure 4:
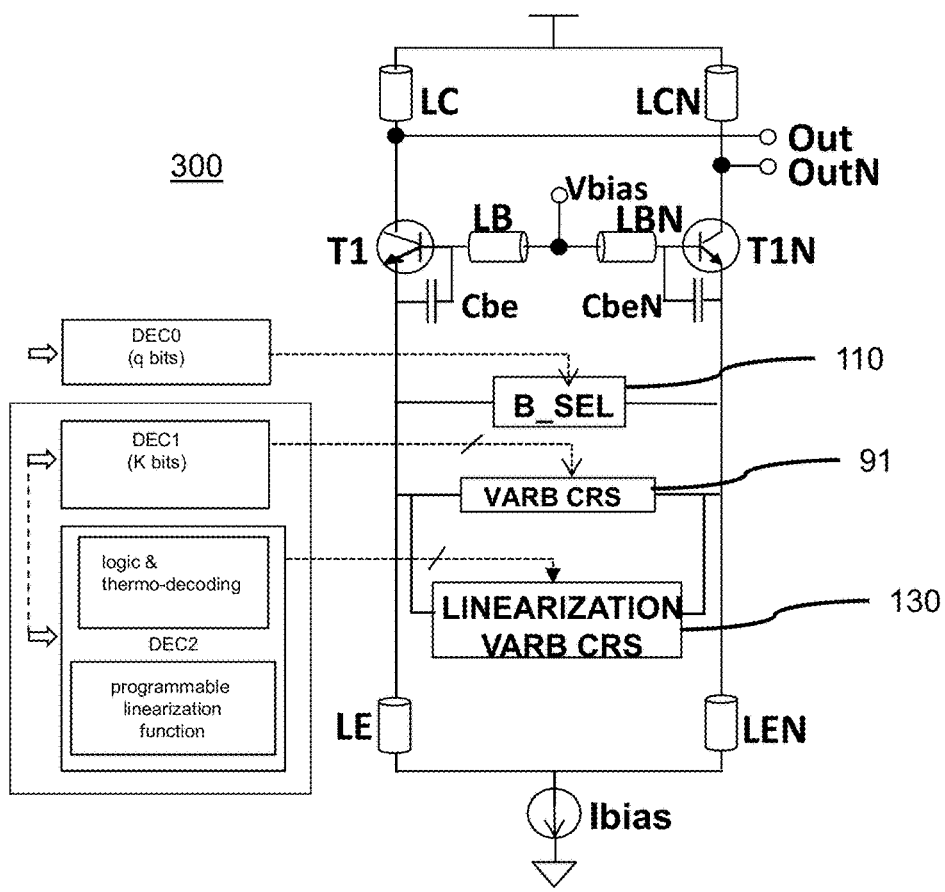
FIG. 4 shows a second embodiment of a digital controlled oscillator.

FIG. 4 shows a Colpitts bipolar-based digital controlled oscillator (DCO) according to an embodiment of the invention. The oscillator 300 differs from the oscillator 300 in that the frequency of oscillation is provided by base inductors LB and LBN which can be implemented as transmission lines and the capacitive arrangement including the band selection capacitor bank 110 B_SEL and the coarse controllable capacitor bank 91.

In the example of FIG. 4, a pair of n-p-n bipolar transistors T1/T1N provides the negative resistance to the LC tank generating the oscillation frequency.

The band selection capacitor bank 110, the coarse controllable capacitor bank 91, and the associated linearization divider 130 are controlled in the same way as in the DCO 100.

The DCO 300 is intended to be used in high frequency applications, for example in DCO operating at radio frequencies (RF) or microwave wave frequencies (MW).

The above capacitive arrangement 91, 130 in the DCO 100 and 300 can be combined with further circuitry to constitute a Digital Frequency Synthesizer. Known also as Digital Phase Locked Loop (PLL), it contains the Digital Controlled Oscillator (DCO) and other blocks such as a phase comparator, frequency dividers, time to digital converter and digital controller, well known as such.

In a practical example of such a device the capacitive divider 130 is used in such a frequency synthesizer to linearize the controllable capacitor bank 91 of the DCO and improve its tuning range by reducing frequency steps dependency on operating frequency.

The Digital Controlled Oscillator is an oscillator of which the output frequency is not controlled by an analogue input control voltage—as in analog VCOs—but by a digital control word.

Since the DCO is controlled by a digital quantized input word, it cannot generate a continuous range of frequencies as its analogue counterpart. Wireless and Radar applications require a very high frequency resolution to meet standard specification. In fact, in a quantized system, we can calculate the minimum required frequency resolution ($f_{RES\_MIN}$) according to equation 6 below, which ensures that quantization is not dominating overall DCO phase noise, including some margin. $f_{REF}$ is the clock reference frequency, $\phi_{DCO}$ is the required DCO phase intrinsic noise, Δf is the offset. The variable 'margin' represents how much the quantization noise is below the intrinsic noise (e.g. 10 dB). DCO total noise ($\phi_{DCO\_T}$) is a sum of DCO intrinsic noise ($\phi_{DCO}$) and DCO quantization noise ($\phi_{DCO\_Q}$).

$$f_{RES\_MIN} = \sqrt{12 \cdot f_{REF} \cdot \Delta f^2 \cdot (\phi_{DCO} + \text{margin})} \qquad (6)$$

As the output frequency in an LC oscillator is related to a resonant circuit, as defined in equation 7, a very high frequency linearization resolution asks for very small capacitance steps.

$$f_{out} = 1/2\pi\sqrt{LC} \qquad (7)$$

The capacitor divider 130 is able to generate the small capacitance steps, resulting in very low frequency steps, via the LC elements in the DCO. The frequency steps can be derived based on the following equations.

$$\omega_0 = \frac{1}{\sqrt{LC}} \qquad (8)$$

$$\frac{\partial \omega_0}{\partial C} = -\frac{\omega_0}{2C} \qquad (9)$$

$$\partial f_0 = \Delta f = \left| -\frac{f_0 \cdot \Delta C}{2C} \right|$$

$$f_0 = \frac{1}{2\pi\sqrt{LC}} \qquad (10)$$

Based on (8), (9) and (10) we have $$\Delta f = \frac{\Delta C}{4\pi C\sqrt{LC}} \qquad (11)$$

This expression (11) shows the variation of DCO output frequency (Δf) for a given ΔC (based on a fixed resonant frequency by L, C). Based on (5) and (11) and ΔC=ΔCeq, we have $$\Delta f = \frac{C_s^2 \times \Delta C_v}{4\pi C\sqrt{LC} \times (2C_v + 2C_f + C_s)^2} \qquad (12)$$

When the linearization frequency range is multiple of the frequency change $\Delta f$, $M^*\Delta f_i$, $M$ being integer, the first control circuit (i.e. the decoder DEC2) is configured for each $M$ to determine a respective capacitance change $\Delta C_i$ associated to the variation of DCO output frequency $\Delta f_i$ and to a particular frequency $f_i$ of the DCO output frequency in the linearization frequency range:

$$\Delta C_i = \frac{2C \times \Delta f_i}{f_i}, \text{ where} \quad (13)$$

$$\Delta f_i = \frac{f_1 - f_2}{M}$$

where $f_1$ is the maximum frequency of the linearization frequency range and $f_2$ is the minimum frequency of the linearization frequency range. By using equation (13), one can derive said change of capacitance $\Delta C_i$. By using equation (11) for another particular frequency within the linearization frequency range, say $f_{i+1}$ one can derive the additional change of capacitance needed to maintain the $\Delta f_i$ constant over frequency.

$$\Delta f_{i+1} = \frac{\Delta C_{i+1} \times f_{i+1}}{2C_{i+1}} = \Delta f_i = \frac{\Delta C_i \times f_i}{2C_i}$$

$C_i$ can be derived from $f_i$ from the equation (10):

$$C_i = \frac{1}{4\pi^2 f_i^2 L} \quad (14)$$

$$\Delta C_{i+1} = \frac{f_i^3}{f_{i+1}^3} \Delta C_i = \frac{f_i^3}{(f_i + i\Delta f_i)^3} \Delta C_i, \quad (15)$$

where $i$ is an integer equal or smaller than $M$.

Based on (13), (14) and (15) practical values can be determined in the example as follows.

In this example, the linearization frequency range can be between $f_1$=20.5 GHz and $f_2$=18.75 GHz, the center frequency can be then fo=19.625 GHz and the frequency change can be $\Delta f_i$=109.375 MHz, i.e. for example controlled by a K=4 bits input decoder.

By taking $f_i$ equal to the maximum frequency in the linearization frequency range $f_1$-$f_2$, i.e. $f_i$=$f_1$=20.5 GHz, and L=200 pH based on (14), we can derive the corresponding capacitance $C_1$=301 fF. The respective capacitance change associated with such particular frequency within the linearization frequency range is, based on (13), $\Delta C_1$=3.24 fF.

By providing the main capacitor bank of the divider with a unit switchable capacitance substantially equivalent to said respective capacitance change, i.e. $\Delta C_v$=$\Delta C_1$=3.24 fF, and the series capacitance and the shunt capacitance with a capacitance multiple integer of $\Delta C_1$, more specifically $C_s$=4*$\Delta C_1$ and $C_f$=13*$\Delta C_1$, we obtain the smallest equivalent capacitance $\Delta Ceq$ of the divider 330, $\Delta C_{eq}$=50.7 aF, where aF refers to atto Farads, i.e. $10^{(-18)}$ Farads. By moving from a frequency change $\Delta f_i$ to another within the frequency linearization range, a multiple integer of the calculated $\Delta Ceq$=50.7 aF is added to $\Delta C_1$ such that the $\Delta f_i$ remains constant for every integer i smaller or equal to M (M being the number of equal frequency changes in the linearization frequency range).

Figure 5:
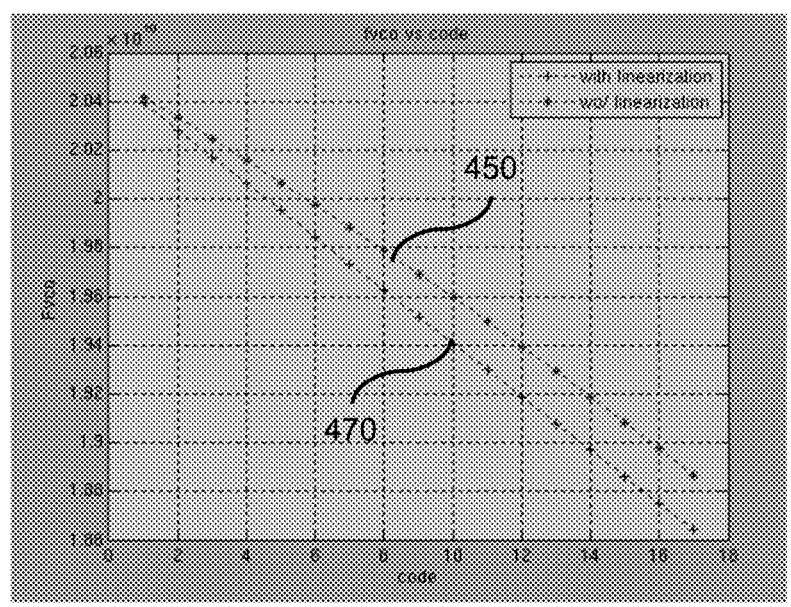
FIG. 5 shows the variation of the output frequency in an example of a digital controlled oscillator.

FIG. 5 shows the variation of the DCO output oscillation frequency for different input codes for the example described in the above paragraphs.

Line 450 shows the variation of the DCO output frequency without using the capacitive arrangement and the linearization method described above. Line 470 shows the variation of the DCO output frequency obtained by using the linearization technique described above in which a suitable capacitive divider is placed in parallel to the controllable capacitor bank to be linearized. From the line 450 can be observed that the frequency changes between inputs codes progressively decrease with increasing frequency. The line 450 cannot cover the full range of frequencies between 18.75 GHz and 20.5 GHz. On the contrary, line 470 shows that the full range of frequencies 18.75 GHz-20.5 GHz can be covered with high resolution by adding a capacitance step which is suitably calculated for each code in order to maintain the frequency changes constant over frequency.

Fine linearization tuning of the frequency step (or resolution) can be achieved by implementing the shunt 2Cf as a bank of capacitors also controlled by a thermometric decoder. Additional coarser tuning is possible by activating on/off the capacitor $C_s$ or the group of parallel capacitors in the series Cs capacitor bank. Thereby, a high linearization resolution in frequency is achieved in the sub kHz order, by using the capacitive divider structure. The high resolution enables precise frequency linearization step, which directly improves transmitted signal integrity, for example a modulation as required by a predefined standard or system. Also, very low frequency steps can be linearized in a digital PLL, which prevents as said to have different quantization noise contribution from different non linearized frequency resolution, thereby improving phase noise performance of the DCO. Also, there is no need for a digital to analog converter (DAC), and no need to use a sigma-delta modulator, so no extra noise added.

The capacitive arrangement 91, 130 and further circuitry may be implemented in an integrated circuit semiconductor device, which provides a very compact solution, and is well suited for a deep submicron process.

The capacitive arrangement 91, 130 can be implemented in any manner suitable for the specific implementation. FIG. 2 showed a differential example of a capacitive divider implemented with capacitors, for example switched capacitors or capacitors which are parallel activated by switches (not shown) or the like. However, other capacitive divider topologies as well as other capacitive elements can be used.

Figure 6:
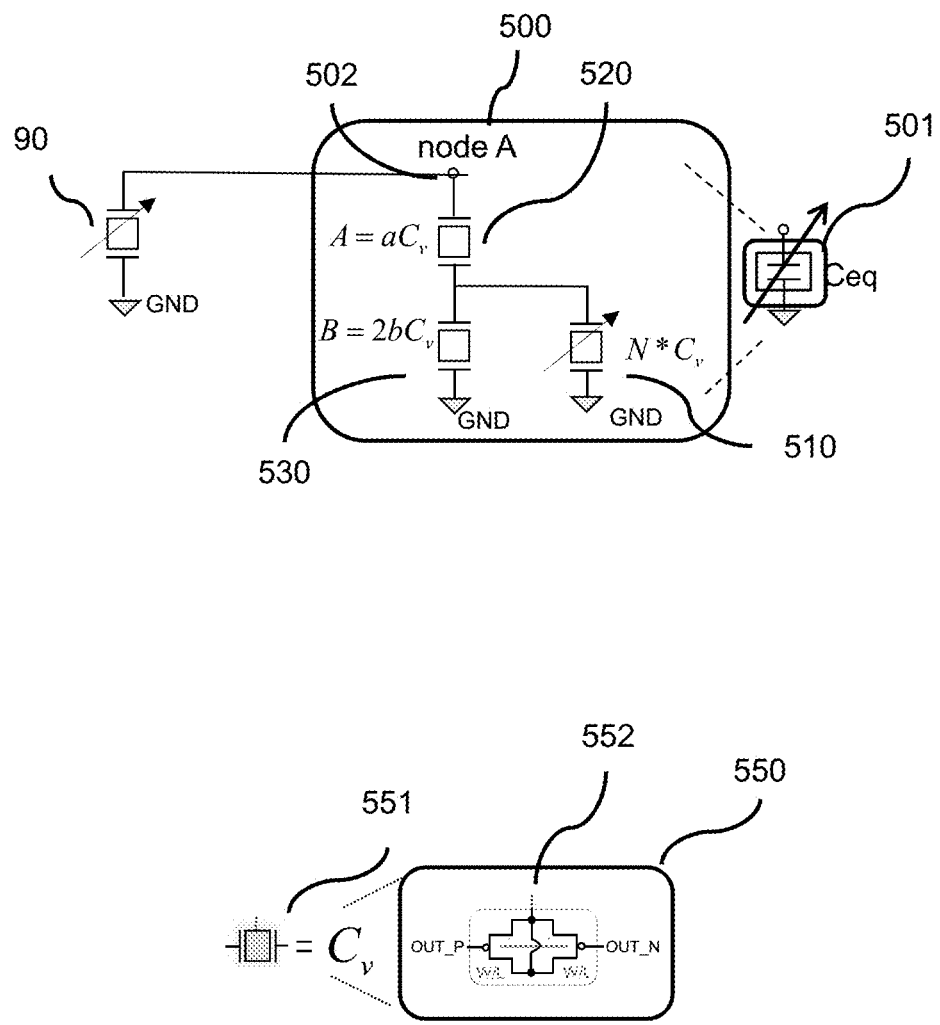
FIG. 6 shows a single ended example of an embodiment of a varactor-based capacitive divider for an electronic device.

FIG. 6 shows a single ended example of a capacitive divider 500 based on varactors according to an embodiment of the invention.

The capacitive divider 500 is for linearizing a controllable varactor bank 90 by modifying the equivalent capacitance 501 ($C_{eq}$) of the capacitive divider 500 in very small and programmable steps. The capacitive divider 500 is arranged in parallel with the controllable varactor bank 90 arranged between node A and ground GND.

The varactor bank 90 has a first number of parallel coupled varactors.

The capacitive divider 500 includes a series arrangement of a first series varactor bank 520 and a main varactor bank 510, and in this example also a first shunt varactor bank 530. The main varactor bank 510 includes a second number N of parallel electrically coupled varactors. The first shunt varactor bank 530 has one terminal arranged between the first series varactor 520 and the main varactor bank 510 and the other terminal electrically coupled to a reference potential GND. The capacitive divider 500 has one or more control inputs (not shown in FIG. 6) for modifying the equivalent capacitance of the capacitive divider 500 by activating the capacitors of the main varactors bank 510 and providing capacitance steps to the controllable varactor bank 90. Each capacitance step can be substantially linearly dependent on the equivalent capacitance ΔCeq of the divider 500 by an i number of activated varactors, i being integer. Each capacitance step is variable over frequency such that between the steps a frequency change Δf of the frequency characteristic is maintained constant in the linearization frequency range.

The main varactor bank 510 has N number of parallel coupled varactors and at least a control input (not shown in FIG. 6) for modifying the equivalent capacitance 501 of the capacitive divider 500 by switching the respective varactors on or off.

The lower part of FIG. 6 shows an example of a varactor. The varactor 550 can be coupled in parallel to other similar varactors to constitute a varactor bank and is shown in the further Figures as a symbol 551 and/or the characters $C_v$. A varactor bank may be designated by indicating the number of varactor by an integer constant, for example $aC_v$, with "a" an integer.

As such, the varactor is a well-known element in electronic circuits, in particular in integrated circuits that contain a multitude of electronic components in semiconductor technology. Varactors are used as voltage-controlled capacitors. They are commonly used in parametric amplifiers, parametric oscillators and voltage-controlled oscillators as part of phase-locked loops and frequency synthesizers. For example, varactors are used in the tuners of television sets to electronically tune the receiver to different stations. Varactors are operated reverse-biased so no current flows, but since the thickness of the depletion zone varies with the applied bias voltage, the capacitance of the diode can be made to vary. Generally, the depletion region thickness is proportional to the square root of the applied voltage; and capacitance is inversely proportional to the depletion region thickness. Thus, the capacitance is inversely proportional to the square root of applied voltage. In the example of the varactor the depletion layer is formed by a MOS device. But the depletion layer can also be made of a p-n-junction or a Schottky diode.

In the lower part of FIG. 6, the varactor unit is shown as a PMOS-based device placed between positive (out_p) and negative (out_n) output nodes of the electronic device. Unit varactor value ($C_v$) depends on the dimensions of the PMOS transistor (W,L), and its smallest size is set by the smallest device size available in the used integration technology.

The capacitive divider 500 as shown in the upper part of FIG. 6 has a main varactor bank 510 of N varactors, indicated by N*$C_v$ and a first series varactor bank 520 of a varactors, indicated by $aC_v$. N and a are integers. The main varactor bank 110 is connected in series with the series varactor bank 520. In the example the other end of the main varactor bank $C_v$ is coupled to a ground reference (GND). It is noted that such ground reference may be any signal line that is effectively a ground level for high frequencies, e.g. a supply terminal like Vdd. For example, the varactor banks may alternatively be coupled between the input terminal and Vdd.

By connecting the main varactor bank 510 and the first series varactor bank 520 in series, the change in the equivalent capacitance 501 by switching a single varactor is smaller than a nominal change in capacitance of a separate varactor bank by such switching. If the number of varactors a is substantially equal to N, then said change is about 50% of the nominal change.

By obtaining very small and programmable steps with the capacitive divider, a very accurate linearization of the controllable varactor bank 90 can be achieved, even for relatively small changes in the equivalent capacitance of the controllable varactor bank 90. By arranging the divider 500 such that its smallest equivalent capacitance is smaller than the smallest capacitance step of the controllable varactor bank, yet a more accurate linearization can be provided.

The capacitive arrangement can have a first shunt varactor bank 530 of b varactors, indicated as 2bCv, b being an integer. The first shunt varactor bank 530 has one terminal coupled to a ground reference (GND) and the other terminal connected between the main varactor bank 510 and the first series varactor bank 520. The specific change step of various capacitive dividers is described in detail below.

The varactors banks are arranged to provide a very low equivalent capacitance, indicated as $C_{eq}$, between a given node (node A) of the circuit and, in this example, a reference (ground or supply). $C_{eq}$ of the capacitive arrangement shown in FIG. 6 is given by following expression:

$$C_{eq} = \frac{aC_v \times (N + 2b)}{a + N + 2b} \quad (1)$$

And the effect of change the equivalent capacitance (ΔCeq) when switching on a varactor within the main varactor bank 510 is given by:

$$\Delta C_{eq} = \frac{a^2 C_v^2}{(a + N + 2b)^2} \times \Delta C_v \quad (2)$$

In practical examples the following values can be achieved:
Switching unit varactor Cv=200 to 400 aF (ΔCv=200 aF), a=100, b=100, b'=200
ΔCeq (b=100)=22 aF
ΔCeq (b'=200)=7.95 aF
Switching unit varactor Cv=200 to 400 aF (ΔCv=200 aF), a=10, b=100, b'=200
ΔCeq (b=100)=0.45 aF
ΔCeq (b'=200)=0.12 aF
aF defines atto Farards, i.e. 10^(−18) Farads.

By switching more than one varactor in the main varactor bank 510, for example i varactors, i being integer equal or lower than N, the capacitance step of the capacitor 90 can be controlled such to be linearly dependent, in the linearization frequency range, on the smallest equivalent capacitance ΔCeq of the divider obtained when only one varactor is switched, i.e. in the examples above 22 aF, 7.95 aF, 0.45 aF or 0.12 aF.

$$\Delta C_{eq} = \frac{a^2 C_v^2}{(a + n + 2b)^2} \times \sum_{1}^{N} \Delta C_v \quad (3)$$

Assuming that the frequency characteristic of the electronic device is controlled by tuning the controllable varactor bank 90 to a particular equivalent capacitance ($C_{eq90}$), if the capacitance step of the bank 90 is sufficiently small, the frequency characteristic can be tuned to a desired value with sufficient accuracy. However, when changing the capacitor, the frequency characteristic does not change linearly with it.

The capacitive divider 500, in this example varactor-based, adds to the particular equivalent capacitance of the bank 90, Ceq90, a capacitance step which linearly depends on the smallest equivalent capacitance of the divider 500 obtained when one capacitor of the main bank 510 is activated in the linearization frequency range, i.e.:

$$C_{step} = C_{eq90} + i \times \Delta C_{v(smallest)},$$

being i integer, equal or lower than N, and equivalent to the number of activated varactors of the main varactor bank 510. $C_{step}$ varies over frequency and the number i is chosen in each $C_{step}$ to maintain the frequency change of the frequency characteristic constant for each $C_{step}$.

Figure 7:
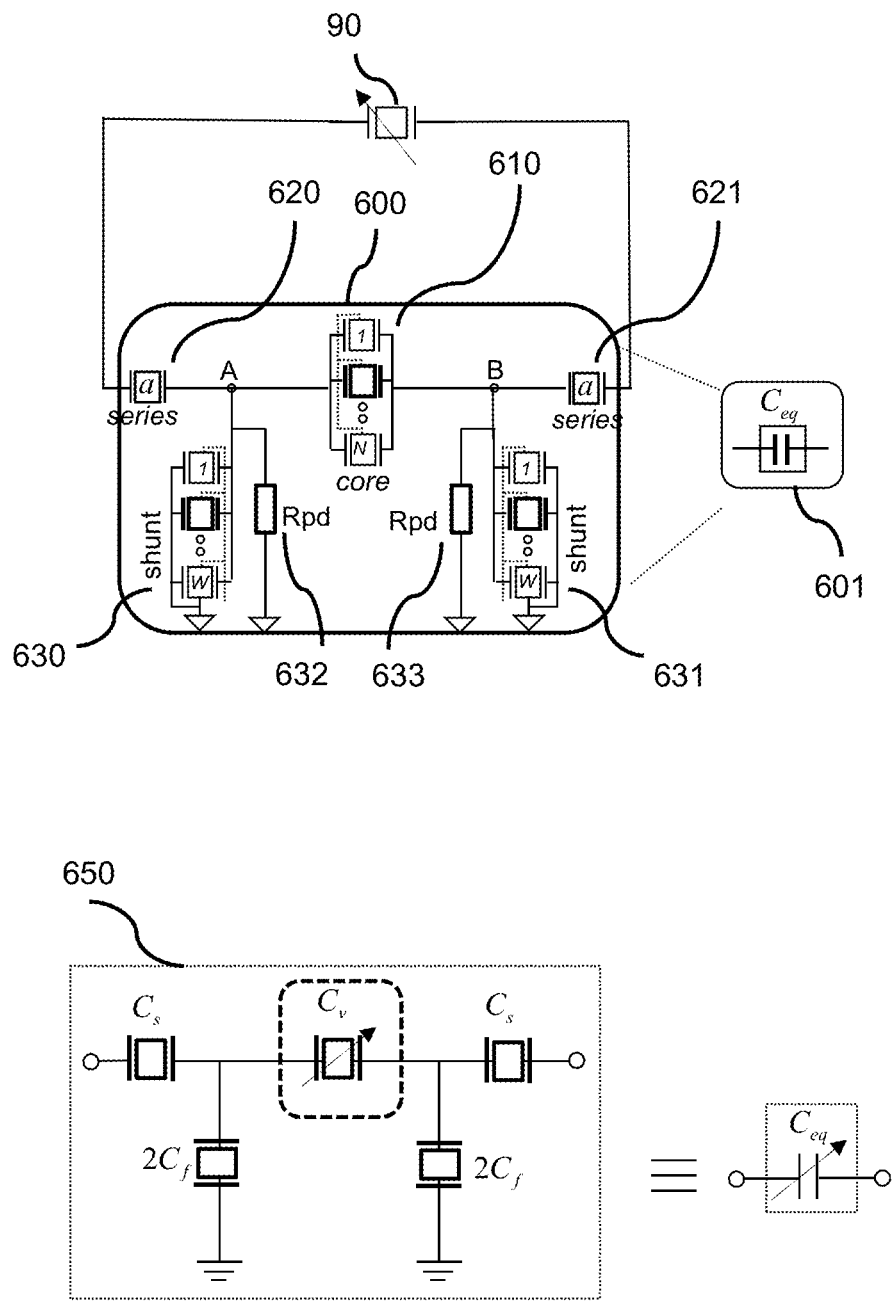
FIG. 7 shows a differential example of an embodiment of a varactor-based capacitive divider for an electronic device.

FIG. 7 shows a differential example of a capacitive divider for an electronic device including varactors. The capacitive divider 600 is for linearizing the parallel varactor bank 90 by modifying the equivalent capacitance 601 ($C_{eq}$) of the capacitive divider 600 in very small and programmable steps. The capacitive divider 600 has varactor banks 610, 620, 630, 621 and 631. The elements are shown as an equivalent capacitive arrangement 650 in the lower part of FIG. 2. The actual varactor banks are shown in the upper part of FIG. 7.

A main varactor bank 610, having N parallel varactors $C_v$ is named "core" and is coupled between nodes A and B. A first series varactor bank 620 having "a" parallel varactors is named "series" and is coupled between node A and an input terminal, and is indicated in the equivalent circuit by $C_s$. A first shunt varactor bank 630 is named "shunt" and is coupled between node A and a ground reference, indicated by 2$C_f$.

FIG. 7 shows a symmetrical arrangement having a second series varactor bank 621 having a parallel varactors coupled between node B and the other input terminal, and indicated in the equivalent circuit also by $C_s$. A second shunt varactor bank 631 is named "shunt", has b varactors and is coupled between node B and the ground reference, and also indicated by 2$C_f$. Two high value resistors Rpd (632, 633) may be placed in parallel with each first and second shunt varactor banks 630 and 631 to provide a pull down DC level at A and B nodes. Since both resistors do not impact behaviour of capacitive divider, they are omitted in further embodiments for simplicity on analytical derivations.

The equivalent fully varactor based capacitive divider 650 has the following equivalent capacitance:

$$C_{eq} = \frac{C_s(C_v + C_f)}{2(C_v + C_f) + C_s} \quad (4)$$

The change on the equivalent capacitance between both input terminals when switching a varactor within the core varactor bank is given by:

$$\Delta C_{eq} = \frac{C_s^2}{(2C_v + 2C_f + C_s)^2} \times \Delta C_v \quad (5)$$

In the proposed embodiment, Cs and Cf are varactors or group of varactors, and both are multiple of the unit varactor Cv, Cs=a·Cv, Cf=b·Cv. In a practical example the capacitance of the proposed fully varactor based differential arrangement varies by an amount called ΔCeq by switching the input control point of a varactor between two input voltage levels, i.e. a digital on/off control, originating two unit varactor values, e.g. Cv (off)=0 F to Cv(on)=3.24 fF. It is noted that fF designates femto Farad, i.e. $10^{-15}$ Farad. Hence ΔCv=3.24 fF. The number of varactors are, a=4, b=13, b'=26, which results, based on formula (5), in:

ΔCeq (b=13)=50.7 aF
ΔCeq (b'=26)=15.4 aF

Hence a very low step in equivalent capacitance is achieved when switching 3.24 fF of a unit varactor. It is noted that other practical step sizes independent of the technology with which the varactors are implemented, can be easily determined by selecting appropriate values for a, b, and n, with respect to the ΔCeq of the used varactors.

As no MOS switches are used in varactor-based divider, a high quality factor Q is achieved, due to only on/off varactors in all capacitor banks. Hence the $Q_{total}$ of the DCO 100 or 300 is optimized, without need to increase $I_{bias}$. Hence the capacitive arrangement can be suited for low power applications. Moreover, a fully-varactor based capacitive arrangement is robust against mismatch and process variations, since only one type of device (varactor) is used.

Further the on/off switching of varactors, e.g. via the control inputs and the thermometric decoders as described with reference to FIG. 1, is well suited to digital PLL applications.

Figure 8:
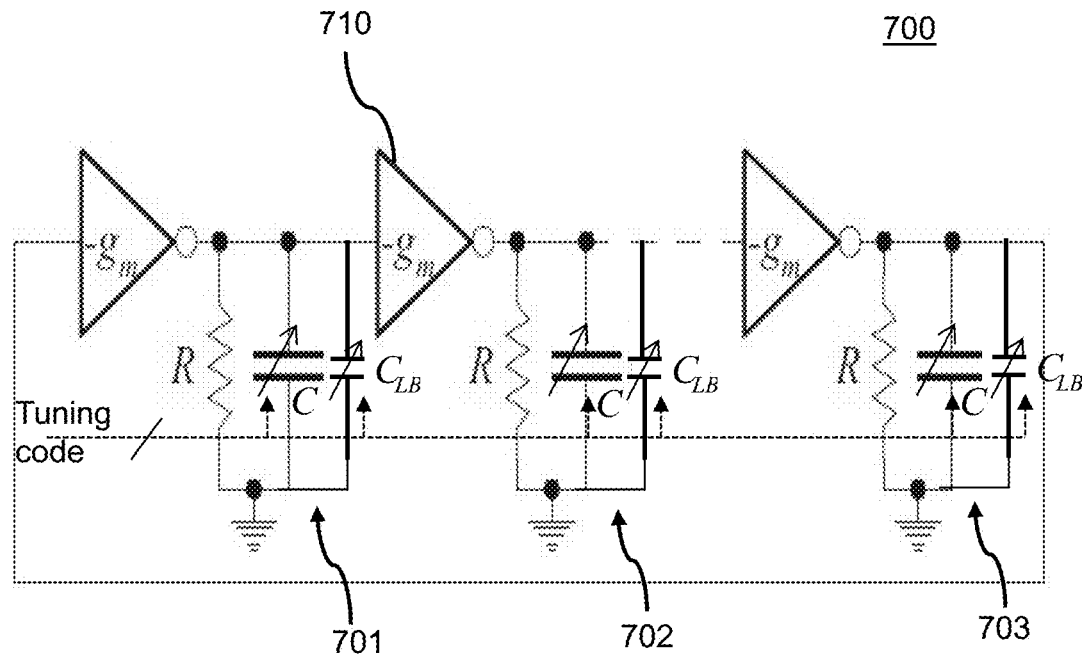
FIG. 8 shows an embodiment of a ring oscillator.

FIG. 8 shows an example of a ring oscillator using the single ended variant of the capacitive divider described with reference to FIG. 6. In the oscillator 700 three amplifying sections (marked $-g_m$) 710 are coupled in a ring. The three outputs are loaded by respective intrinsic resistors R and capacitive arrangements 701, 702, 703. Each capacitive arrangement may be constituted by the intrinsic capacitance of –gm stage (not shown in FIG. 8) in parallel with a tunable capacitor, marked C, for tuning the oscillator frequency of the ring oscillator 700 in parallel with the single ended arrangement, $C_{LB}$, as shown in FIG. 6.

In the ring oscillator the capacitive arrangement $C_{LB}$ is applied to linearize the tunable capacitor C during tuning of the output frequency (fosc) with a very high resolution based on the very low capacitance step provided by the capacitive divider. fosc depends on the delay (td) of N cascaded stages:

$$f_{OSC} = \frac{1}{2 \cdot N \cdot t_d} \quad (16)$$

The delay is defined as the change in output voltage at the midpoint of the transition, $V_{SW}$, divided by the slew rate, $I_{ss}/C$, resulting in a delay per stage of $C \cdot V_{SW}/I_{ss}$. C is here the intrinsic capacitance at input. The output frequency is:

$$f_{OSC} = \frac{I_{SS}}{2 \cdot N \cdot V_{SW} \cdot C}$$

Similar control circuits as described with reference to the example of FIG. 1 can be used to control the tunable capacitor C and the capacitive divider $C_{LB}$ for controlling the output frequency (fosc) and the linearization function to be dynamically applied to the tunable capacitor C.

A similar approach described with reference to the DCO of FIG. 1 can be used to linearize the tunable capacitor C with the capacitive divider $C_{LB}$ in a linearization frequency range of the output frequency (fosc) of the oscillator 700.

The devices 100, 300 or 700 can include one or more capacitive arrangements including the controllable capacitor bank and capacitive divider in parallel with the controllable capacitor bank. Each capacitive arrangement can be arranged in parallel with each other and used for linearizing in the linearization frequency range with different resolution. For example, a coarse resolution capacitive arrangement can be arranged in parallel with a medium resolution capacitive arrangement which can be in turns arranged in parallel with a small resolution capacitive arrangement to linearize in the linearization frequency range with a coarse, medium and small resolution, respectively. Each capacitive arrangement can be controlled independently from each other with dedicated control circuits e.g. of the type described with reference to FIG. 1.

Figure 9:
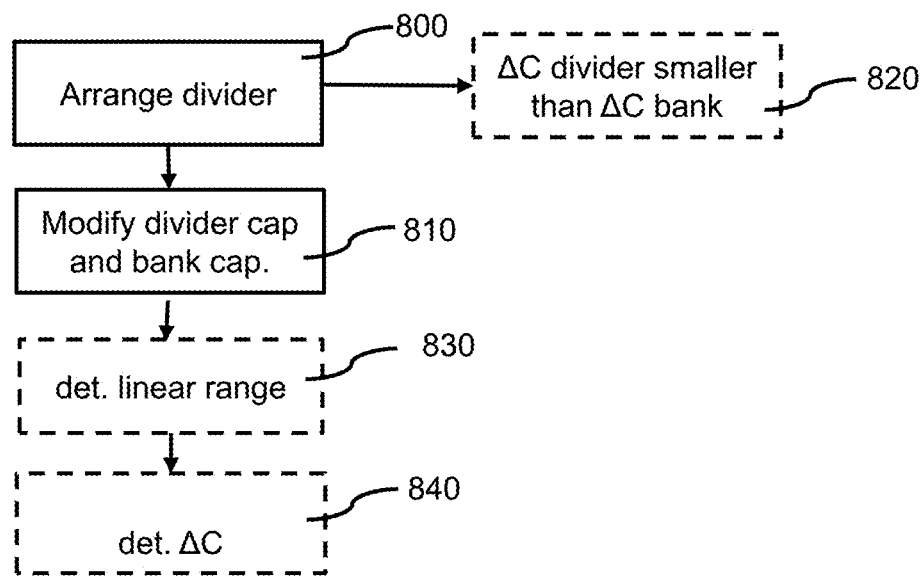
FIG. 9 shows a flow diagram of a method of linearizing a controllable capacitor bank of an electronic device.

FIG. 9 shows a flow diagram of a method of linearizing a controllable capacitor bank, having a corresponding bank capacitance, of an electronic device in a linearization frequency range of a frequency characteristic of the electronic device by using a capacitive divider having a corresponding divider capacitance. The capacitive divider can be any of the divider described with reference to FIG. 2, FIG. 6 or FIG. 7. The electronic device can be a digital controlled oscillator DCO 100 or 300 as described with reference to FIG. 1, FIG. 4 or the ring oscillator 700 as described with reference to FIG. 8.

The method provides arranging 800 a capacitive divider in parallel with the controllable capacitor bank, wherein the capacitive divider includes a series arrangement of a first series capacitance, and a main capacitor bank. The main capacitor bank includes a second number n of parallel electrically coupled capacitors.

Arranging 800 the capacitive divider can further include providing 820 the capacitive divider with a smallest divider capacitance smaller than a smallest bank capacitance.

The method further provides modifying 810 the bank capacitance and the divider capacitance by activating one or more capacitors of the controllable capacitor bank and the main capacitors bank for providing capacitance steps such that each capacitance step Cstep is variable over frequency and for each capacitance step a frequency change Δf of the frequency characteristic (for example an oscillation frequency of the electronic device) is maintained constant in the linearization frequency range.

The capacitance step can be substantially linearly dependent on the smallest equivalent capacitance of the divider obtained when one capacitor is activated in the linearization frequency range.

The method can further divide 830 the linearization frequency range in M, M being integer, frequency intervals each corresponding to the frequency change Δf, and determine 840 a respective capacitance change ΔC associated to the frequency change Δf and to a particular frequency within the linearization frequency range.

The respective capacitance of one activated capacitor of the divider can be substantially equivalent to said respective capacitance change ΔC.

In the foregoing specification, the invention has been described with reference to specific examples of embodiments of the invention. It will, however, be evident that various modifications and changes may be made therein without departing from the scope of the invention as set forth in the appended claims.

The connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the embodiments of the present invention is, for the most part, composed of electronic components and circuits known to those skilled in the art, circuit details have not been explained in any greater extent than that considered necessary, for the understanding and appreciation of the underlying concepts of the embodiments of the present invention and in order not to obfuscate or distract from the teachings of the embodiments of the present invention.

All embodiments provide an electronic device comprising a controllable capacitor bank having a bank capacitance comprising a first number of parallel electrically coupled switchable capacitors for controlling a frequency characteristic of the electronic device; a capacitive divider having a divider capacitance arranged in parallel with the controllable capacitor bank and configured to linearize the controllable capacitor bank in a linearization frequency range of the frequency characteristic. The capacitive divider comprises a series arrangement of a first series capacitance, and a main capacitor bank comprising a second number of parallel electrically coupled switchable capacitors. The electronic device further comprises a control circuit having a plurality of control outputs coupled to a corresponding plurality of control inputs of the capacitive divider and the controllable capacitor bank. The control circuit is configured to modify the bank capacitance and the divider capacitance by activating one or more switchable capacitors of the controllable capacitor bank and the main capacitors bank for providing capacitance steps, each capacitance step being variable over frequency such that for each capacitance step a frequency change Δf of the frequency characteristic is maintained constant in the linearization frequency range.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or being "operably connected," or "operably electrically coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Furthermore, the devices may be physically distributed over a number of apparatuses, while functionally operating as a single device. Also, devices functionally forming separate devices may be integrated in a single physical device. Also, the units and circuits may be suitably combined in one or more semiconductor devices. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases one or more or at least one and indefinite articles such as "a" or an. The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device comprising:
   a controllable capacitor bank having a bank capacitance comprising a first number of parallel electrically coupled switchable capacitors for controlling a frequency characteristic of the electronic device;
   a capacitive divider having a divider capacitance arranged in parallel with the controllable capacitor bank and configured to linearize the controllable capacitor bank in a linearization frequency range of the frequency characteristic, the capacitive divider comprising a series arrangement of a first series capacitance, and a main capacitor bank comprising a second number of parallel electrically coupled switchable capacitors; and
   a control circuit having a plurality of control outputs coupled to a corresponding plurality of control inputs of the capacitive divider and the controllable capacitor bank, the control circuit configured to modify the bank capacitance and the divider capacitance by activating one or more switchable capacitors of the controllable capacitor bank and the main capacitors bank for providing capacitance steps, each capacitance step being variable over frequency such that for each capacitance step a frequency change $\Delta f$ of the frequency characteristic is maintained constant in the linearization frequency range.

2. An electronic device as claimed in claim 1, wherein the controllable capacitor bank and the capacitive divider are arranged such that a smallest divider capacitance is smaller than a smallest bank capacitance.

3. An electronic device as claimed in claim 1, wherein the linearization frequency range is a multiple integer of the frequency change $M*\Delta f$, M being integer, and the control circuit is configured to
   determine a respective capacitance change $\Delta C$ of the capacitive divider associated with the frequency change $\Delta f$ and with a particular frequency within the linearization frequency range.

4. An electronic device as claimed in claim 2, wherein the respective capacitance of one activated capacitor of the capacitive divider is substantially equivalent to said respective capacitance change $\Delta C$.

5. An electronic device as claimed in claim 1, wherein the capacitive divider comprises a first shunt capacitance having one terminal coupled between the first series capacitance and the main capacitor bank and the other terminal electrically coupled to a reference potential.

6. An electronic device as claimed in claim 5, wherein the capacitive divider further comprises
   a second series capacitance electrically coupled in series with the main capacitor bank between the main capacitor bank and the controllable capacitor bank.

7. An electronic device as claimed in claim 6, wherein the capacitive divider further comprises
   a second shunt capacitance having one terminal coupled between the main capacitor bank and the second series capacitance and another terminal electrically coupled to the reference potential.

8. The electronic device as claimed in claim 7, wherein the capacitive divider is arranged such that
   the first series capacitance is substantially equal to the second series capacitance and the first shunt capacitance is substantially equal to the second shunt capacitance.

9. The electronic device as claimed in claim 1, wherein each switchable capacitor of the main capacitor bank has a unit capacitance, and wherein the first series capacitance and the first shunt capacitance are substantially multiple integer of the unit capacitance.

10. The electronic device as claimed in claim 1, wherein the capacitive divider comprises
    a first shunt capacitance having one terminal coupled between the first series capacitance and the main capacitor bank and the other terminal electrically coupled to a reference potential,
    a second series capacitance electrically coupled in series with the main capacitor bank between the main capacitor bank and the controllable capacitor bank,
    a second shunt capacitance having one terminal coupled between the main capacitor bank and the second series capacitance and another terminal electrically coupled to the reference potential,
    each switchable capacitor of the main capacitor bank has a unit capacitance, and wherein the first series capacitance, the second series capacitance, the first shunt capacitance and the second shunt capacitance are substantially multiple integer of the unit capacitance.

11. An electronic device as claimed in claim 1, wherein the main capacitor bank comprises N parallel coupled switchable capacitors, N being integer greater than a number of capacitance steps.

12. The device as claimed in claim 1, wherein the device is a digitally controlled oscillator, the controllable capacitor bank is configured for controlling an output frequency of the digitally controlled oscillator and wherein the capacitive divider is configured for linearizing the controllable capacitor bank.

13. The device as claimed in claim 1, wherein the digitally controlled oscillator is a ring oscillator comprising an odd number of delay stages, each stage having an output being coupled to the controllable capacitor bank and to the capacitive divider for adapting the frequency characteristic of the digitally controlled oscillator and linearizing the controllable capacitor bank.

14. The device as claimed in claim 1, wherein the control circuit comprises a first control circuit configured to control the capacitive divider and a second control circuit configured to control the controllable capacitor bank, wherein the first control circuit comprises
    a logic and thermometric decoding controller configured to set a number of parallel coupled switchable capacitors of the main capacitor bank for linearizing the controllable capacitor bank in the linearization frequency range, and
    a programmable linearization function configured to determine a linearization vector defining the capacitance step for each frequency change.

15. The device as claimed in claim 1, wherein first series capacitance is a first series varactor or a first series varactor bank of a plurality of parallel coupled varactors, the controllable capacitor bank is a controllable varactor bank of a further plurality of parallel coupled varactors and the main capacitor bank is a main varactor bank of another plurality of parallel coupled varactors.

16. An integrated circuit, comprising at least one electronic device as claimed in claim 1 and a band selection capacitor bank arranged in parallel with the controllable capacitor bank for enabling a frequency trimming of the frequency characteristic to a desired operation frequency range of the electronic device.

17. A method of linearizing a controllable capacitor bank of an electronic device in a linearization frequency range of a frequency characteristic of the electronic device, wherein the controllable capacitor bank has a bank capacitance and comprises a first number of parallel electrically coupled switchable capacitors for controlling the frequency characteristic of the electronic device, the method comprising:

arranging a capacitive divider in parallel with the controllable capacitor bank, wherein the capacitive divider comprises a series arrangement of a first series capacitance, and a main capacitor bank comprising a second number of parallel electrically coupled capacitors, modifying the bank capacitance and the divider capacitance by activating one or more capacitors of the controllable capacitor bank and the main capacitors bank for providing capacitance steps, each capacitance step being variable over frequency such that for each capacitance step a frequency change $\Delta f$ of the frequency characteristic is maintained constant in the linearization frequency range.

18. The method of claim 17, wherein arranging the capacitive divider comprises providing the capacitive divider with a smallest divider capacitance smaller than a smallest bank capacitance.

19. The method of claim 17, comprising dividing the linearization frequency range in M, M being integer, equal frequency intervals, each frequency interval corresponding to the frequency change $\Delta f$, and determining a respective capacitance change $\Delta C$ associated to the frequency change $\Delta f$ and to a particular frequency within the linearization frequency range.

20. The method of claim 19, wherein the respective capacitance of one activated capacitor is substantially equivalent to said respective capacitance change $\Delta C$.

\* \* \* \* \*